United States Patent [19]

Cohen et al.

[11] Patent Number: 4,574,330
[45] Date of Patent: Mar. 4, 1986

[54] HEAT SINK FOR DISSIPATING HEAT GENERATED BY ELECTRONIC DISPLAYS

[75] Inventors: Marvin M. Cohen; Francis L. Payne, both of Tucson, Ariz.

[73] Assignee: Burr-Brown Corporation, Tucson, Ariz.

[21] Appl. No.: 763,072

[22] Filed: Aug. 5, 1985

Related U.S. Application Data

[63] Continuation of Ser. No. 450,983, Dec. 20, 1982, abandoned.

[51] Int. Cl.⁴ ............................................. H05K 7/20
[52] U.S. Cl. .................................... 361/388; 165/185; 174/16 HS; 361/383
[58] Field of Search .............................. 361/380–389, 361/395, 399, 400; 174/16 HS; 165/80 B, 185; 357/80, 81; 313/510

[56] References Cited

U.S. PATENT DOCUMENTS 3,549,783 12/1970 Bendrick ............................ 361/381
4,204,248 5/1980 Proffit et al. ....................... 361/388
4,245,274 1/1981 MacDonald ....................... 361/399
4,394,600 7/1983 Flannagan ......................... 313/510

FOREIGN PATENT DOCUMENTS 877644 9/1961 United Kingdom ............. 165/80 B

OTHER PUBLICATIONS

Archey, "IBM Technical Disclosure Bulletin", vol. 19, No. 2, 7/76, p. 412.
C. S. K. Ng, "IBM Technical Disclosure Bulletin", vol. 21, No. 9, 2/79, p. 3591.
Dumaine et al., "IBM Technical Disclosure Bulletin", vol. 20, No. 4, 9/77, p. 1472.
Tiffany, "IBM Technical Disclosure Bulletin", vol. 13, No. 1, 6/70, p. 58.

Primary Examiner—A. D. Pellinen
Assistant Examiner—Greg Thompson
Attorney, Agent, or Firm—Weiss & Holloway

[57] ABSTRACT

An article for dissipating heat generated by an alphanumeric display which is mounted on an electronic circuit board. The article includes a heat sink which is coupled to the underside of the alphanumeric display. The heat sink has at least one transfer member which extends through the electronic circuit board and is coupled to a dissipation plate. The dissipation plate is exposed to an environment which is removed from the immediate environment of the electronic circuit board. Heat generated by the alphanumeric display is transferred to the heat sink and through the transfer member(s) to the dissipation plate. The heat is then dissipated in an environment which is removed from that of any electronic components mounted on the electronic circuit board.

5 Claims, 3 Drawing Figures

HEAT SINK FOR DISSIPATING HEAT GENERATED BY ELECTRONIC DISPLAYS

This application is a continuation of application Ser. No. 450,983, filed Dec. 20, 1982, now abandoned.

BACKGROUND OF THE INVENTION

1. Field of the Invention

This invention relates generally to heat sinks, and more specifically, to a heat sink utilized in conjunction with an alphanumeric display to transfer heat generated by the display through a heat sink to a dissipation plate which is exposed to the exterior of a circuit housing.

2. Disclosure of the Prior Art

Alphanumeric displays are utilized in many electronic circuits to convey outputs provided by the circuits. Unfortunately, alphanumeric displays commonly generate a large amount of heat. In many situations, circuit performance is very dependent on the temperature of the environment in which the circuit operates. As the temperature of the environment increases, sensitive components of the circuit may exhibit altered performance and negatively affect the reliability of the circuit.

Since alphanumeric displays are often a major source of heat to the immediate environment in which a circuit operates, the need exists to provide a heat sink for effectively transferring heat generated by the alphanumeric display from the immediate environment of the circuit to an atmosphere or environment which is removed from that of the circuit.

SUMMARY OF THE INVENTION

It is an object of the present invention to provide a heat sink which efficiently transfers heat generated by an alphanumeric display to an environment removed from the immediate environment of the circuit. Thus, the circuit performance will not be affected by increased temperature in the immediate circuit environment.

Another object of the invention is to provide a heat sink which is readily adaptable to a variety of electronic displays.

Another object of the invention is to provide a heat sink which is coupled to an alphanumeric display through a thermally conductive layer. Thus, the heat generated by the alphanumeric display is efficiently transferred from the display to the heat sink with minimal loss or dissipation of the heat to the immediate environment.

Accordingly, an article for dissipating heat generated by an alphanumeric display which is mounted on an electronic circuit board comprises a heat sink coupled to the underside of the alphanumeric display. A portion of the heat sink extends through the electronic circuit board. Additionally, a dissipation plate communicates with an environment removed from the electronic circuit board and is coupled to the portion of the heat sink which extends through the electronic circuit board. The heat sink transfers heat from the alphanumeric display to the dissipation plate to dissipate the heat in the environment which is removed from the immediate environment of the electronic circuit board. A layer of thermally conductive material may be placed between the alphanumeric display and the heat sink to enhance the efficient transfer of heat from the alphanumeric display to the heat sink.

The foregoing and other objects, features and advantages will be apparent from the following, more particular, description of the preferred embodiments of the invention, as illustrated in the accompanying drawings.

DESCRIPTION OF THE PREFERRED EMBODIMENTS

Figure 1:
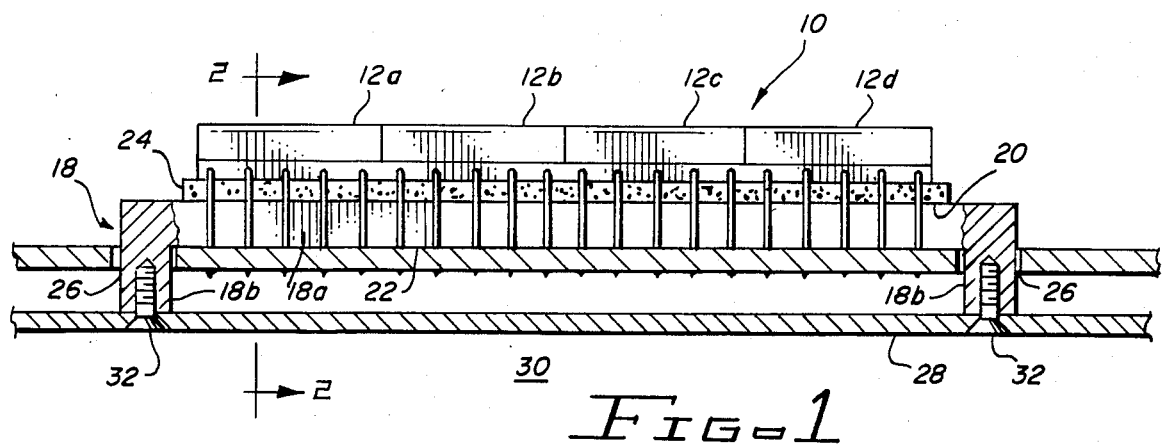
FIG. 1 is a sectional-vertical view of the alphanumeric display coupled to the inventive heat sink and mounted to an electronic circuit board taken along lines 1—1 of FIG. 3.
Figure 2:
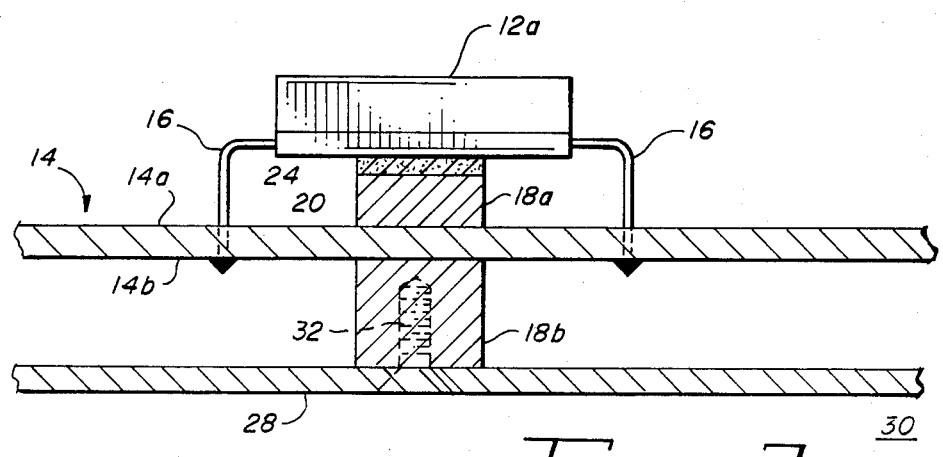
FIG. 2 is a sectional-vertical view of the alphanumeric display and heat sink taken along lines 2—2 of FIG. 1.
Figure 3:
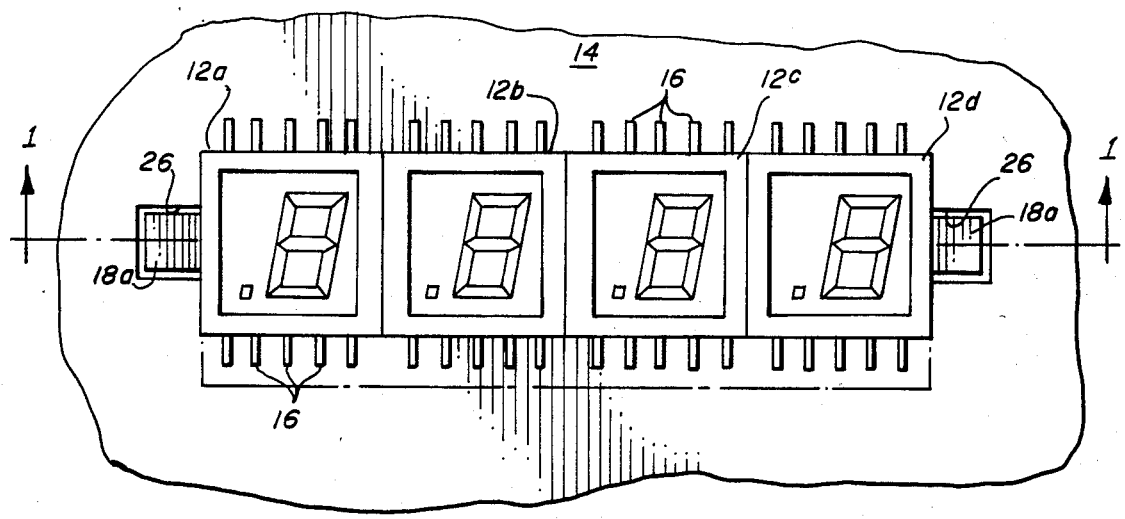
FIG. 3 is a top-horizontal view of the alphanumeric display and heat sink of FIG. 1 and FIG. 2.

Referring to the Figures, an alphanumeric display, referenced generally by the numeral 10, comprises four individual display units 12a, 12b, 12c and 12d. The alphanumeric display 10 receives signals from an electronic circuit board 14 through multiple lead frame pins 16. In the past, the alphanumeric display 10 was simply mounted directly to the non conductive surface 14a of the electronic circuit board 14, and the lead frame pins 16 soldered at the conductive side 14b of the electronic circuit board 14. When the alphanumeric display 10 was activated, heat was transferred from the back side of the alphanumeric display 10 to the electronic circuit board 14. As a result, performance of electronic components (not shown) mounted on the electronic circuit board 14 were adversely affected by the temperature increase of their immediate environment.

To alleviate this problem, a heat sink 18 is coupled to the underside of the alphanumeric display 10. The heat sink 18 comprises a rectangular horizontal member 18a which has a planar top face 20 and a planar bottom face 22. The planar top face 20 is thermally coupled to the underside of the alphanumeric display 10. The planar bottom face 22 is mounted to the non-conductive surface 14a of the electronic circuit board 14. A layer of conductive material 24 may be placed between the top planar face 20 of the horizontal member 18a and the underside of the alphanumeric display 10 to enhance heat transfer to the horizontal member 18a. The alphanumeric display 10 is pressed flush against the top planar face 20 of the horizontal member 18a, or if a conductive layer 24 is applied to the top planar face 20, the alphanumeric display 10 is placed flush against the conductive layer 24. The multiple lead frame pins 16 are then soldered to the conductive surface 14b of the electronic circuit board 14. In this manner, the alphanumeric display 10 is held tightly against the heat sink 18 to assure efficient thermal transfer.

The heat sink 18 further comprises at least one, and preferably two, vertical transfer members 18b. The vertical transfer members 18b extend from the rectangular member 18a through holes 26 in the electronic circuit board 14, and are coupled to a dissipation plate 28. The dissipation plate 28 is exposed to an environment 30 which is removed from the electronic circuit board 14. The vertical transfer members 18b are tapped to receive recessed screws 32, thereby holding the dissipation plate tightly to the vertical transfer members 18b. The dissipation plate could effectively serve as the back plate of a case for the circuit (not shown).

In operation, the alphanumeric display 10, comprised of individual displays 12a, 12b, 12c and 12d, receives signals from the electronic circuit board 14, and simultaneously generates heat when activated. The heat is transferred through the conductive layer 24 to the horizontal member 18a of the heat sink 18. The heat is then transferred through the vertical transfer members 18b to the dissipation plate 28, where it is dissipated in the removed environment 30. Thus, electronic components mounted to the electronic circuit board 14 are not affected by an increased temperature in the immediate environment due to heat generated by the alphanumeric display.

While the invention has been particularly shown and described with reference to preferred embodiments thereof, it will be understood by those skilled in the art that the foregoing and other changes in form and details may be made therein without departing from the spirit and scope of the invention.

What is claimed is:

1. An article for dissipating heat comprising in combination a heat generating alphanumeric display and an electronic circuit board, said alphanumeric display being electrically connected to said circuit board;

a solid heat sink thermally coupled to a portion of the underside of said alphanumeric display, said solid heat sink having a surface contact portion smaller than the width of the underside of said alphanumeric display and in thermal contact with said portion of the underside of said alphanumeric display, said surface contact portion of said solid heat sink being centrally disposed with respect to the width of the alphanumeric display;

a heat dissipating plate spaced from said circuit board, at least one solid extension portion of said solid heat sink extending through said circuit board and in thermal and mechanical contact with said dissipating plate, a second portion of said heat sink contiguous to said solid extension portion located on a non-conductive surface portion of said circuit board, said heat sink transferring heat generated by said alphanumeric display directly to said dissipating plate.

2. The article as defined in claim 1, wherein said dissipating plate is exposed to an environment removed from said electronic circuit board, said dissipating plate dissipating heat transferred by said heat sink in the removed environment.

3. The article as defined in claim 1 further comprising a layer of conductive material located between said heat sink and the underside of said alphanumeric display, the layer of conductive material enhancing the transfer of heat from said alphanumeric display to said heat sink.

4. The article as defined in claim 1, wherein said heat sink comprises:

a rectangular horizontal member having a planar top surface portion which is thermally coupled to said portion of the underside of said alphanumeric display, and having a planar bottom surface portion which is located on said non-conductive surface portion of said electronic circuit board; and a pair of vertical transfer members extending through said electronic circuit board and mechanically and thermally connected to said dissipating plate, said vertical transfer members transferring heat generated by the alphanumeric display from said horizontal member of said heat sink to said dissipating plate.

5. The article as defined in claim 1, wherein said heat sink is fabricated of aluminum.

* * * * *